(12) United States Patent
Spinner et al.

(10) Patent No.: US 10,641,273 B2
(45) Date of Patent: May 5, 2020

(54) CHARGING APPARATUS FOR A COMBUSTION ENGINE

(71) Applicant: BorgWarner Inc., Auburn Hills, MI (US)

(72) Inventors: Gerd Spinner, Alzey (DE); Dietmar Metz, Meckenheim (DE); Andreas Bleil, Ludwigsburg (DE); Victor Ritzhaupt, Karlsruhe (DE)

(73) Assignee: BorgWarner Inc., Auburn Hills, MI (US)

( * ) Notice: Subject to any disclaimer, the term of this patent is extended or adjusted under 35 U.S.C. 154(b) by 9 days.

(21) Appl. No.: 14/898,200

(22) PCT Filed: Jun. 23, 2014

(86) PCT No.: PCT/US2014/043634
§ 371 (c)(1),
(2) Date: Dec. 14, 2015

(87) PCT Pub. No.: WO2014/209873
PCT Pub. Date: Dec. 31, 2014

(65) Prior Publication Data
US 2016/0123336 A1    May 5, 2016

(30) Foreign Application Priority Data
Jun. 28, 2013   (DE) ........................ 10 2013 010 860

(51) Int. Cl.
*F04D 25/06*      (2006.01)
*F04D 29/42*      (2006.01)
(Continued)

(52) U.S. Cl.
CPC .............. *F04D 25/06* (2013.01); *F02B 33/40* (2013.01); *F02B 39/10* (2013.01); *F04D 17/10* (2013.01);
(Continued)

(58) Field of Classification Search
CPC .. F04D 25/06; F04D 13/0686; F04D 29/5813; F04D 3/0606; F04D 17/10;
(Continued)

(56) References Cited

U.S. PATENT DOCUMENTS 4,862,009 A    8/1989 King
5,343,127 A    8/1994 Maiocchi
(Continued)

FOREIGN PATENT DOCUMENTS

DE    19927741 A1    12/1999
GB     2348322 A      9/2000
(Continued)

OTHER PUBLICATIONS

Supplementary European Search Report dated Jan. 1, 2017, in European Application No. EP 14817322.
(Continued)

*Primary Examiner* — Philip E Stimpert
(74) *Attorney, Agent, or Firm* — Eric L. Doyle; Stephan A. Pendorf; Patent Central LLC

(57) ABSTRACT

A charging apparatus (20) for a combustion engine, having a compressor (1) which has a compressor housing (2) in which a compressor wheel (3) is arranged, the compressor wheel being mounted on one end (4) of a rotor shaft (5), and which has a compressor housing rear wall (6); and having an electric motor (7) which has a stator winding (12) which surrounds a magnet (11), which is arranged on the rotor shaft (5), on the outside. The stator winding (12) is an iron-free stator winding, and the electric motor (7) is a brushless DC motor.

6 Claims, 4 Drawing Sheets

(51) Int. Cl.
  *F04D 29/58* (2006.01)
  *H02K 3/47* (2006.01)
  *H02K 3/04* (2006.01)
  *H02K 5/20* (2006.01)
  *F02B 33/40* (2006.01)
  *H02K 7/14* (2006.01)
  *F04D 17/10* (2006.01)
  *F04D 29/28* (2006.01)
  *F02B 39/00* (2006.01)
  *F02B 39/10* (2006.01)
  *H01L 23/473* (2006.01)

(52) U.S. Cl.
  CPC ....... *F04D 25/0606* (2013.01); *F04D 25/068* (2013.01); *F04D 29/284* (2013.01); *F04D 29/4206* (2013.01); *F04D 29/582* (2013.01); *F04D 29/584* (2013.01); *F04D 29/5806* (2013.01); *F04D 29/5813* (2013.01); *H02K 3/04* (2013.01); *H02K 3/47* (2013.01); *H02K 5/20* (2013.01); *H02K 7/14* (2013.01); *F02B 39/005* (2013.01); *H01L 23/473* (2013.01)

(58) Field of Classification Search
  CPC ....... F04D 29/284; F04D 29/582; H02K 3/47; H02K 3/04; H02K 5/20; H02K 7/14; H02K 1/185; F02B 33/40; F02B 39/10; F02B 39/005
  USPC ......... 417/423.8; 310/179, 216.001–216.004
  See application file for complete search history.

(56) References Cited

U.S. PATENT DOCUMENTS

| | | | |
|---|---|---|---|
| 5,638,796 A * | 6/1997 | Adams, III | F02B 33/40 123/565 |
| 5,870,894 A | 2/1999 | Woollenweber et al. | |
| 6,032,466 A * | 3/2000 | Woollenweber | F01D 25/164 417/407 |
| 6,102,672 A | 8/2000 | Woollenweber et al. | |
| 6,129,524 A | 10/2000 | Woollenweber et al. | |
| 6,342,770 B1 | 1/2002 | Stephan et al. | |
| 6,507,991 B1 | 1/2003 | Ozawa et al. | |
| 2001/0049036 A1 * | 12/2001 | Raiser | F04B 39/0027 429/444 |
| 2002/0134082 A1 * | 9/2002 | Bolz | F02B 33/40 60/608 |
| 2003/0038555 A1 | 2/2003 | Ozawa et al. | |
| 2005/0073210 A1 * | 4/2005 | Rocky | H02K 3/34 310/216.006 |
| 2006/0028024 A1 * | 2/2006 | Franke | B60K 6/26 290/40 C |
| 2007/0035187 A1 * | 2/2007 | Verhaegen | H02K 3/24 310/59 |
| 2007/0041851 A1 | 2/2007 | Shibui et al. | |
| 2008/0124233 A1 | 5/2008 | Spooner | |
| 2010/0018203 A1 * | 1/2010 | Richards | F01D 15/10 60/598 |
| 2011/0058967 A1 | 3/2011 | Arita et al. | |
| 2012/0153762 A1 * | 6/2012 | Tassinario | H02K 3/04 310/156.32 |

FOREIGN PATENT DOCUMENTS

| | | |
|---|---|---|
| JP | 06121584 A | 4/1994 |
| JP | 2000295807 A | 10/2000 |
| JP | 2001069727 A | 3/2001 |
| JP | 2002231288 A | 8/2002 |
| JP | 2006203957 A | 8/2006 |
| JP | 2007510395 A | 4/2007 |
| JP | 2012062777 A | 3/2012 |
| WO | 2005043713 A2 | 5/2005 |
| WO | 2009121035 A1 | 10/2009 |

OTHER PUBLICATIONS

Written Opinion and International Search Report in International Application No. PCT/US2014/043634 dated Oct. 29, 2014.
Chinese Office Action (with English language translation) dated Aug. 2, 2017, in Chinese Patent Application No. 201480034207.9.
Japanese Office Action (with English language translation) dated Jan. 12, 2018, in Japanese Application No. 2016-523831.
Office Action dated Feb. 7, 2018, in European Application No. 14 817 322.2.
Second Chinese Office Action (with English language translation) dated Apr. 2, 2018, in Chinese Application No. 201480034207.9.
Third Chinese Office Action (with English language translation) dated Apr. 11, 2019, in Chinese Application No. 201480034207.9.
Office Action dated Oct. 11, 2018, in European Application No. 14 817 322.2.
English language translation of first Japanese Office Action dated Oct. 23, 2019, in Japanese Application No. 2018-145497.

* cited by examiner

CHARGING APPARATUS FOR A COMBUSTION ENGINE

BACKGROUND OF THE INVENTION

Field of the Invention

The invention relates to a charging apparatus for a combustion engine or fuel cell.

Description of the Related Art

The compressor of a charging apparatus of this kind is provided with a brushless DC motor which uses a laminated, undercut structure as a stator winding.

The disadvantage of this arrangement can primarily be considered that of the structure of the stator winding being complex and the magnetic properties of said structure requiring improvement.

BRIEF SUMMARY OF THE INVENTION

The object of the present invention is therefore to provide a charging apparatus as claimed in the preamble of claim 1 which has a simplified structure and better power characteristics.

This object is achieved by the features of claim 1.

A low level of noise during running and a relatively high torque result from the stator winding being arranged on a slot-free, cylindrical inner surface of a laminated core and the electric motor being in the form of a brushless motor.

The structure of the stator winding of the charging apparatus according to the invention results in the advantage that the active surface can be wound virtually without air gaps. This increases the filling level and also the resulting packing density.

In combination with the electric motor which is designed as a brushless motor, in particular a DC motor, according to the invention, advantages in respect of the power characteristics of the charging apparatus according to the invention are also produced in particular, preferably in a power range of up to 10 kW, in particular up to 5 kW, particularly preferably up to 3.5 kW, at voltages of approximately 11 V to 15 V and at rotation speeds of up to 80,000 rpm, in particular up to 70,000 rpm, particularly preferably up to 60,000 rpm.

The dependent claims contain advantageous developments of the invention.

If the compressor housing rear wall is provided with a cooling jacket, this results in an extremely compact and cost-effective structure in which the electric motor, the bearing of the shaft of the electric motor and the power electronics circuit can be cooled at the same time, advantageously by the provided cooling jacket.

The invention also relates to a method for improving the starting behavior of a charging apparatus for a combustion engine, which charging apparatus comprises a compressor which is driven by means of an electric motor.

The method according to the invention initially comprises the method step of temporarily applying a voltage to a coil or winding of the electric motor of the compressor, as a result of which the rotor of the electric motor is oriented in a defined rotor position. Owing to this temporary application of a voltage and owing to the resulting orientation of the rotor, the rotor position is known to a downstream electronics system.

The rotor can then be accelerated from this defined rotor position.

This results in the advantage that the use of sensors for ascertaining the position of the rotor can be dispensed with, said sensors otherwise being required to determine the position of the rotor around which the magnetic field randomly rotates in brushless motors in order to carry along the rotor. As a result, is generally possible to accelerate the compressor to the operating rotation speed 8 ms more quickly than with a magnetic field which initially rotates randomly.

Although DE 10 2011 084 299 A1 discloses applying a voltage to a coil when the electric motor is stationary, this is done for the purpose of controlling the coil resistance in said prior art document.

In the method according to the invention, the voltage is applied, as explained above, in order to orient the rotor in a defined start position, this, in addition to avoiding the need for sensors, optimizing the run-up behavior of the electric motor.

According to an advantageous development of the method according to the invention, the voltage is applied before an immediately imminent compression process of the charging apparatus according to the invention, such as, for example, when a combustion engine is idling or an internal combustion engine is in overrun operation mode.

BRIEF DESCRIPTION OF ME SEVERAL VIEWS OF THE DRAWINGS

Further details, advantages and features of the present invention can be gathered from the following description of exemplary embodiments with reference to the drawing, in which.

DETAILED DESCRIPTION OF THE INVENTION

Figure 1:
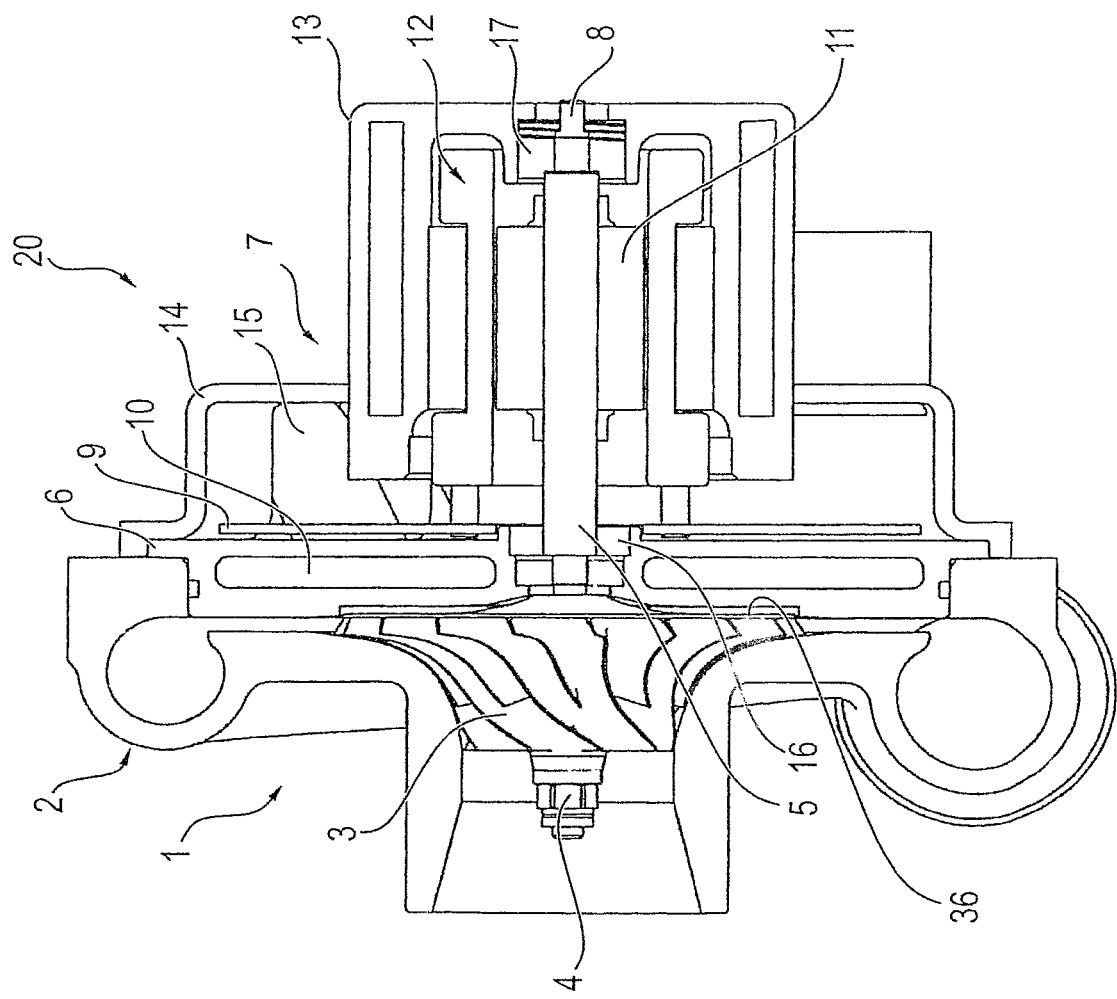
FIG. 1 is a schematically slightly simplified sectional illustration through a first embodiment of a charging apparatus according to the invention.

FIG. 1 shows an embodiment of a charging apparatus 20 comprising an electrically driven compressor 1. The compressor 1 has a compressor housing 2 in which a compressor wheel 3 is arranged. The compressor wheel 3 is mounted on one end 4 of a rotor shaft 5.

As is also illustrated in FIG. 1, the compressor housing 2 has a compressor housing rear wall 6 which is in the form of a compressor housing cover in the illustrated exemplary embodiment.

In this case, the compressor housing rear wall 6 is provided with a cooling jacket 10, preferably for cooling water. As illustrated in FIG. 1, the compressor housing rear wall 6 is arranged behind the compressor wheel and is fixed to the compressor housing 2 and closes said compressor housing in this way.

The compressor 1 also has an electric motor 7. The electric motor 7 comprises a shaft 8 which is connected to a rotor shaft 5. In the illustrated embodiment, the shaft 8 and the rotor shaft 5 are designed as an integral component, as is shown in detail in FIG. 1. In this case, the shaft 8 is in the form of a shaft stub which has a smaller outside diameter than the rotor shaft 5 and on which a bearing 16 is arranged. The end 4 of the rotor shaft 5 is likewise of reduced diameter in relation to the rotor shaft 5 and is fitted with a second bearing 17. As shown in FIG. 1, the bearing 17 is supported against a bearing section of a stator housing 13, whereas the bearing 16 is supported, by way of its outer ring, in a recess of the compressor housing rear wall 6.

A magnet 11 is also provided on the rotor shaft 5, said magnet interacting with a stator winding 12 which surrounds said magnet on the outside.

The embodiment of the compressor 1 according to FIG. 1 also has a dirt-protection cover 14 which is mounted on the stator housing 13 or on the compressor housing rear wall 6 and in which electronics components 15 of a power electronics circuit or electronics printed circuit board 9 are arranged.

As illustrated in FIG. 1, the power electronics circuit 9 is arranged between the compressor housing rear wall 6 and the electric motor 7 or the dirt-protection cover 14. To this end, the power electronics circuit 9 can be firmly clamped, for example, between the dirt-protection cover 14 and the compressor housing rear wall 6, or else mounted, for example fixedly adhesively bonded, on one of the two parts.

This arrangement results in the advantage that the power electronics circuit 9 is arranged adjacent to the cooling jacket 10, this considerably improving the cooling effect of said cooling jacket with respect to the power electronics circuit 9. The power electronics circuit 9 can comprise all of the required components for fulfilling the function of an electronic commutator. Said power electronics circuit is, in particular, a control circuit comprising transistors or so-called MOSFETs. The power electronics circuit 9 can also comprise sensors, in particular Hall sensors. The electronic components 15 comprise, in particular, a capacitor, amongst others.

A thermally conductive paste can be provided between the power electronics circuit 9 and the cooling jacket 10 or the compressor housing rear wall 6 in which the cooling jacket 10 is arranged.

The compressor housing rear wall 6 could also be formed by an end wall of the stator housing 13, in which end wall the bearing 17 would then be arranged. In this embodiment, the stator housing 13 likewise has an inner cooling arrangement and therefore a cooling jacket 10, wherein, in this embodiment too, the power electronics circuit 9 is arranged between the compressor housing rear wall 6 and the electric motor 7 or its stator housing 13, and therefore enjoys the same advantages of a compact construction and improved cooling of the components.

Figure 2:
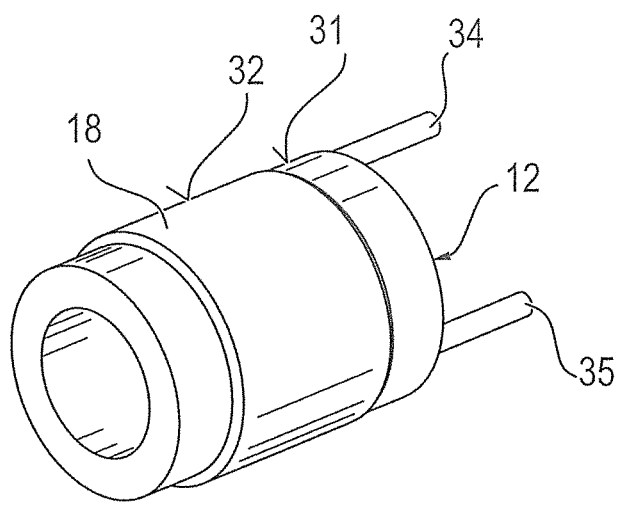
FIG. 2 is a perspective illustration of a stator winding according to the invention.
Figure 3:
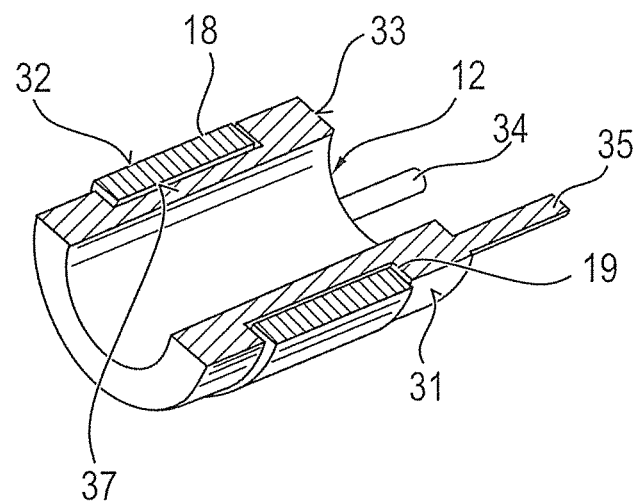
FIG. 3 is a perspective illustration of the stator winding according to FIG. 2 in a sectioned state.

The stator winding 12 according to the invention is illustrated in detail in FIGS. 2 and 3.

The stator winding 12 is in the form of an iron-free winding which is self-supporting and, in the case of the example, forms a hollow cylinder. A laminated core 18 is arranged on the stator winding 12, to which end the stator winding 12 has a recess 19, into which the laminated core 18 is inserted, in the particularly preferred embodiment which is illustrated in FIG. 3. As can be gathered from looking at FIGS. 2 and 3 together, the outer circumferential surface 32 of the laminated core 18 projects radially beyond the outer circumferential surface 31 of the stator winding 12 in this case.

FIGS. 2 and 3 also show that two winding taps 34 and 35 are provided on an end surface 33 of the stator winding 12.

Figure 4:
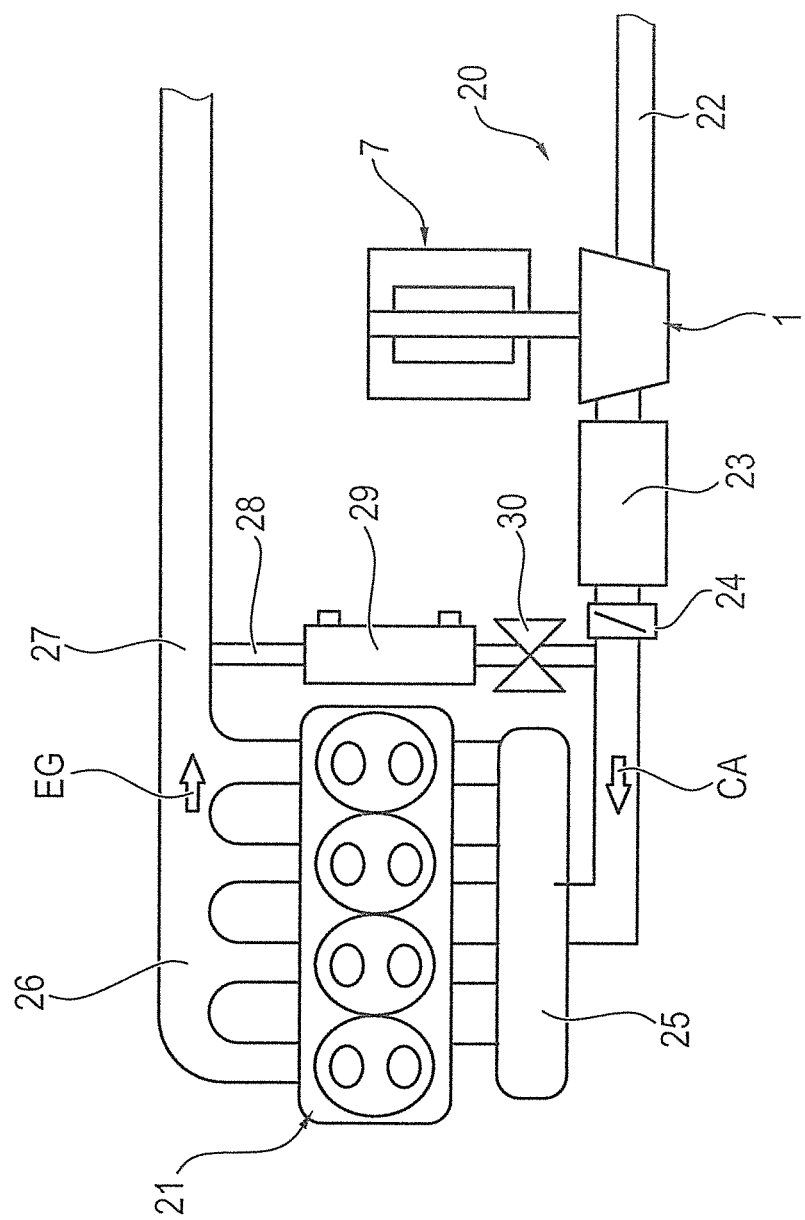
FIG. 4 is a basic diagram of a combustion engine with a charging apparatus according to the invention.
Figure 5:
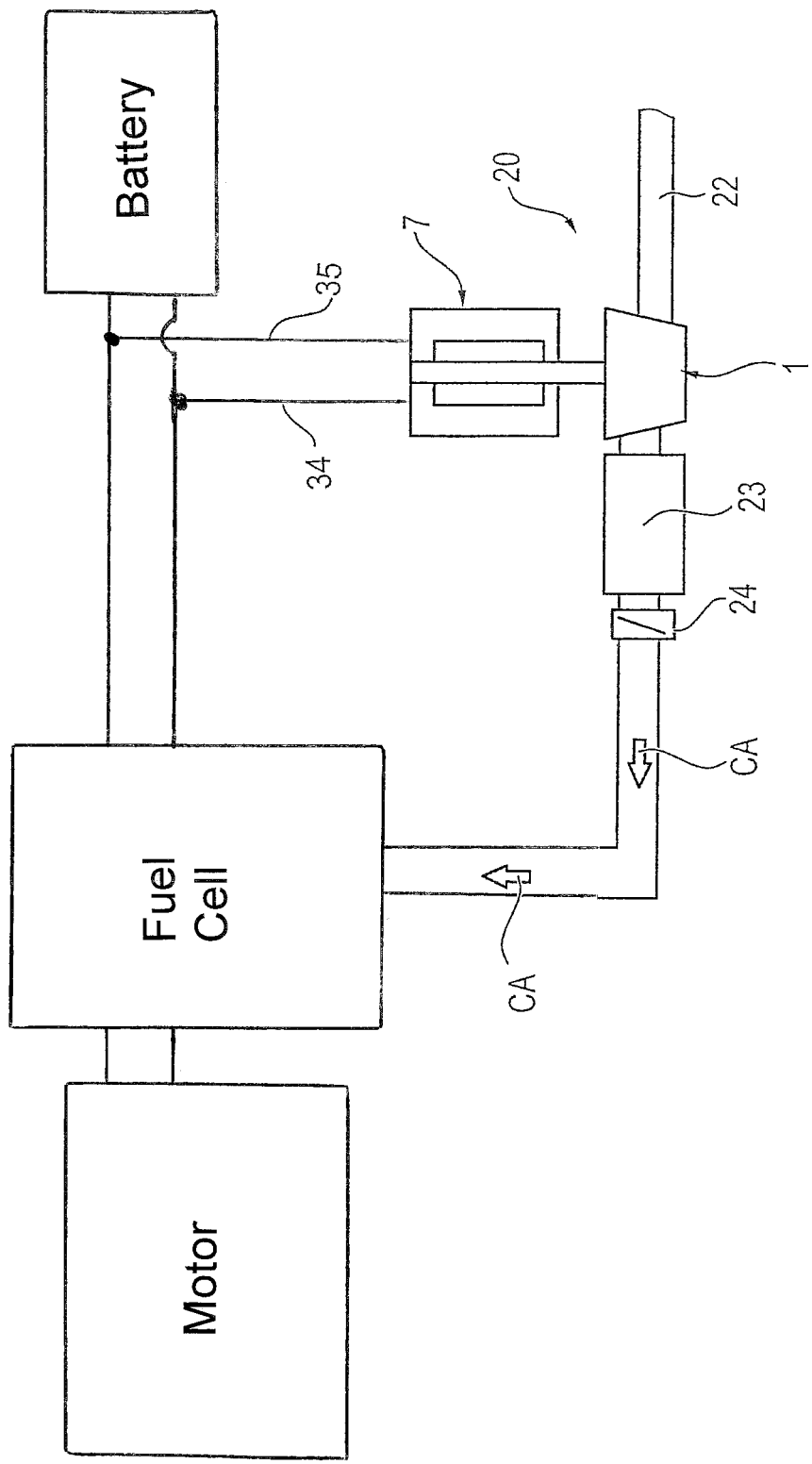
FIG. 5 is a schematic diagram of a fuel cell provided with a charging apparatus according to the invention.

The charging apparatus 20 which was explained above with reference to FIGS. 1 to 3 is suitable, in particular, for combustion engines, such as internal combustion engines as shown in FIG. 4, or fuel cells as shown in FIG. 5.

FIG. 4 is a schematically highly simplified illustration of a combustion engine 21, for example in the form of a (diesel or petrol) internal combustion engine. The combustion engine 21 has an intake line 22 in which the compressor 1 of the charging apparatus 20 is arranged, said compressor being driven by the electric motor 7. A charge air cooler 23, followed by a throttle 24, can be arranged downstream of the compressor 1 in the intake line 22. The compressed air, which is symbolized by the arrow CA, from the compressor 1 is supplied to an intake manifold 25, and the cylinders of the combustion engine 21 are supplied with the compressed air from said intake manifold.

The exhaust gas EG is supplied to an exhaust gas line 27 via an exhaust gas manifold 26.

In the particularly preferred embodiment which is illustrated in FIG. 4, the internal combustion engine 21 is also provided with an exhaust gas return line 28 in which an exhaust gas cooler 29 and a valve 23 are arranged. However, said exhaust gas return line 28, together with its components 29 and 30, is not mandatory, but rather constitutes merely a particularly preferred embodiment.

In addition to the above written description of the invention, reference is hereby explicitly made, for additional disclosure thereof, to the diagrammatic illustration of the invention in FIGS. 1 to 4.

LIST OF REFERENCE SYMBOLS

1 Compressor
2 Compressor housing
3 Compressor wheel
4 End
5 Rotor shaft
6 Compressor housing rear wall
7 Electric motor, in particular a brushless DC motor
8 Shaft
9 Power electronics circuit/electronics printed circuit board
10 Cooling jacket
11 Magnet
12 Stator winding
13 Stator housing
14 Dirt-protection cover
15 Electronics components
16, 17 Bearings
18 Laminated core
19 Recess
20 Charging apparatus
21 Combustion engine
22 Intake line
23 Charge air cooler
24 Throttle
25 Intake manifold
26 Exhaust gas manifold
27 Exhaust gas line
28 Exhaust gas return line
29 Exhaust gas cooler
30 Valve
31, 32 Outer circumferential surface
33 End surface
34, 35 Winding taps
36 Compressor wheel rear side
37 Inner surface
CA Compressed air
EG Exhaust gas

The invention claimed is:

1. A charging apparatus (20) for a combustion engine, comprising:
   a compressor (1) which has a compressor housing (2) in which a compressor wheel (3) is arranged, said compressor wheel being mounted on one end (4) of a rotor shaft (5), and which compressor housing (2) has a compressor housing rear wall (6) which is adjacent to a compressor wheel rear side (36); and
   a brushless electric motor (7) which has
      a rotor including a magnet arranged on the outside of a shaft (8),
      a stator including
         a stator winding (12), which surrounds the magnet (11), the stator winding (12) having axial ends having an outer circumference (31) having a diameter, the stator winding (12) having a recess (19) between the axial ends, the recess having an outer surface having a diameter smaller than the outer diameter of the axial ends, wherein the stator winding is self-supporting, and
         an annular laminated core (18) having a cylindrical inner surface (37), the annular laminated core (18) arranged in the recess (19) of the stator winding (12), the cylindrical inner surface (37) in direct contact with the outer surface of the stator winding recess (19), the outer circumferential surface (32) of the annular laminated core (18) projecting radially beyond the outer circumferential surface (31) of the axial ends of the stator winding (12), and
      a stator housing (13) which surrounds the stator winding (12) on the outside, wherein:
   a first bearing (16) is supported in a recess of the compressor housing rear wall (6) and a second bearing (17) is supported in a bearing section of the stator housing (13),
   the magnet (11) is arranged on the rotor shaft (5) between the first bearing (16) and the second bearing (17),
   a power electronics circuit (9) arranged between the compressor housing rear wall (6) and the electric motor (7), and
   the compressor housing rear wall (6) of the compressor housing (2) has a cooling jacket (10).

2. The charging apparatus as claimed in claim 1, comprising a dirt-protection cover (14) arranged on the compressor housing rear wall (6).

3. The charging apparatus as claimed in claim 1, wherein winding taps (34, 35) are provided on an end surface (33) of the stator winding (12).

4. The charging apparatus as claimed in claim 1, wherein the combustion engine is an internal combustion engine.

5. The charging apparatus as claimed in claim 1, wherein the stator winding 12 is in the form of an iron-free winding.

6. A charging apparatus (20) connected to supply compressed air to a fuel cell, comprising
   a charging apparatus comprising
   a compressor (1) which has a compressor housing (2) in which a compressor wheel (3) is arranged, said compressor wheel being mounted on one end (4) of a rotor shaft (5), and which compressor housing (2) has a compressor housing rear wall (6) which is adjacent to a compressor wheel rear side (36); and
   a brushless electric motor (7) which has
      a rotor including a magnet arranged on the outside of a shaft (8), and
      a stator including
         a stator winding (12), which surrounds the magnet (11), the stator winding (12) having axial ends having an outer circumference (31) having a diameter, the stator winding (12) having a recess (19) between the axial ends, the recess having an outer surface having a diameter smaller than the outer diameter of the axial ends, wherein the stator winding is self-supporting, and
         an annular laminated core (18) having a cylindrical inner surface (37), the annular laminated core (18) arranged in the recess (19) of the stator winding (12), the cylindrical inner surface (37) in direct contact with the outer surface of the stator winding recess (19), the outer circumferential surface (32) of the annular laminated core (18) projecting radially beyond the outer circumferential surface (31) of the axial ends of the stator winding (12);
   a stator housing (13) which surrounds the stator winding (12) on the outside, wherein:
   a first bearing (16) is supported in a recess of the compressor housing rear wall (6) and a second bearing (17) is supported in a bearing section of the stator housing (13),
   the magnet (11) is arranged on the rotor shaft (5) between the first bearing (16) and the second bearing (17),
   a power electronics circuit (9) arranged between the compressor housing rear wall (6) and the electric motor (7), and
   the compressor housing rear wall (6) of the compressor housing (2) has a cooling jacket (10) between the compressor wheel and power electronics circuit (9);
   a fuel cell; and
   means for connecting the fuel cell to the charging apparatus.

* * * * *